United States Patent
Yasuhara

(10) Patent No.: US 9,793,808 B1
(45) Date of Patent: Oct. 17, 2017

(54) ENHANCED BIDIRECTIONAL CURRENT SENSING AND REPLICATION

(71) Applicant: Coolstar Cayman, Inc., Sunnyvale, CA (US)

(72) Inventor: James Andrew Akio Yasuhara, San Francisco, CA (US)

(73) Assignee: Coolstar Cayman, Inc., Grand Cayman (KY)

( * ) Notice: Subject to any disclaimer, the term of this patent is extended or adjusted under 35 U.S.C. 154(b) by 0 days.

(21) Appl. No.: 15/216,461

(22) Filed: Jul. 21, 2016

(51) Int. Cl.
| | |
|---|---|
| H02M 3/158 | (2006.01) |
| H02M 1/088 | (2006.01) |
| H03F 3/26 | (2006.01) |
| H03F 3/45 | (2006.01) |
| G01R 19/00 | (2006.01) |
| H02M 1/00 | (2006.01) |

(52) U.S. Cl.
CPC ........ H02M 3/158 (2013.01); G01R 19/0092 (2013.01); H02M 1/088 (2013.01); H02M 2001/0009 (2013.01)

(58) Field of Classification Search
CPC ................. H02M 3/158; H02M 1/088; H02M 2001/0009; G01R 19/0092; H03F 3/45; H03F 3/26; H03F 1/34
USPC .. 327/52, 53, 58, 60, 62, 63, 65–69, 71, 72, 327/74, 77–81, 88, 89, 96, 127, 246, 266, 327/274, 280, 287, 359, 560–563
See application file for complete search history.

(56) References Cited

U.S. PATENT DOCUMENTS

| | | | | |
|---|---|---|---|---|
| 5,497,122 A | * | 3/1996 | Somayajula | H03F 3/45192 330/253 |
| 5,537,079 A | * | 7/1996 | Gosser | H03F 3/3066 330/265 |
| 6,002,299 A | * | 12/1999 | Thomsen | H03F 1/083 330/107 |
| 7,215,198 B1 | * | 5/2007 | Dasgupta | H03F 1/34 330/256 |
| 7,327,129 B2 | | 2/2008 | Chen et al. | |
| 8,354,886 B2 | * | 1/2013 | Brekelmans | H03F 1/308 333/267 |
| 2003/0184379 A1 | * | 10/2003 | Ivanov | H03F 1/307 330/255 |
| 2006/0119429 A1 | * | 6/2006 | Lim | H03F 3/189 330/253 |

(Continued)

Primary Examiner — Brandon S Cole
(74) Attorney, Agent, or Firm — Otterstedt, Ellenbogen & Kammer, LLP

(57) ABSTRACT

A current replication circuit includes a bias circuit and a first transistor sized, relative to a second transistor to be sensed, according to a first scaling factor, the first transistor having an on-resistance associated therewith. The current replication circuit further includes at least one transconductance amplifier having first and second signal paths. The first signal path is connected with the bias circuit in a closed loop configuration such that a quiescent bias point of the transconductance amplifier is controlled as a function of the on-resistance of the first transistor. The second signal path is connected with the second transistor in an open loop configuration and is adapted to convert a sensed input voltage to a corresponding current output signal as a function of the quiescent bias point of the transconductance amplifier, the current output signal being proportional to a current flowing through the second transistor.

17 Claims, 5 Drawing Sheets

(56) References Cited

U.S. PATENT DOCUMENTS

2012/0154048 A1* 6/2012 Myles ................... H03F 1/0205
 330/260
2015/0077183 A1* 3/2015 Ciubotaru ........... H03F 3/45179
 330/254

* cited by examiner

ENHANCED BIDIRECTIONAL CURRENT SENSING AND REPLICATION

FIELD

The present invention relates generally to the electrical, electronic and computer arts, and, more particularly, to current sensing and replication circuits.

BACKGROUND

Current sensing, in general, is widely used in a variety of systems and applications; it is often beneficial to know the amount of current being delivered to a load. For example, in low-power consumer products (e.g., portable computing devices, cell phones, etc.), the supply current can be monitored for controlling system operation to optimize battery life. Knowing the load current can also be used to make safety-critical decisions in over-current protection circuits.

When sensing load current, a designer typically chooses to place a sense impedance (e.g., resistor or transistor device) either between the supply rail and load, or between the load and ground; the former is called high-side sensing whereas the latter is called low-side sensing. Ideally, the sensing circuitry added to a given circuit for detecting the load current has no impact on circuit performance. In practice however, there is likely some observable effect on circuit performance resulting from, among other factors, parasitic contributions of the sensing circuitry.

Traditional sensing circuits sometimes rely on replicating the load current (scaled or unscaled), either through the use of a current mirror and/or operational amplifier, to generate a sense output signal that is proportional to the sensed load current. However, because most current replication circuits are closed loop, speed must be limited in order to maintain stability, which is undesirable, particularly in high-speed switching applications.

SUMMARY

One or more embodiments of the present invention provide enhanced techniques for replicating a current through a sensed circuit element.

In accordance with one embodiment, a current replication circuit includes a bias circuit and a first transistor sized, relative to a second transistor to be sensed, according to a first scaling factor, the first transistor having an on-resistance associated therewith. The current replication circuit further includes at least one transconductance amplifier having first and second signal paths. The first signal path is connected with the bias circuit in a closed loop configuration such that a quiescent bias point of the transconductance amplifier is controlled as a function of the on-resistance of the first transistor. The second signal path is connected with the second transistor in an open loop configuration and is adapted to convert a sensed input voltage to a corresponding current output signal as a function of the quiescent bias point of the transconductance amplifier, the current output signal being proportional to a current flowing through the second transistor.

In accordance with another embodiment, a current sensing and replication circuit includes a first transistor sized, relative to a second transistor to be sensed, according to a first scaling factor, and at least one transconductance amplifier coupled with the first transistor. The first transistor has an on-resistance equal to an on-resistance of the second transistor multiplied by the first scaling factor. The first transistor receives a prescribed reference current and generates a first voltage as a function of the reference current and the on-resistance of the first transistor. A transconductance of the transconductance amplifier is set in a closed-loop arrangement as a function of the on-resistance of the first transistor. The transconductance amplifier generates an output sense signal in an open-loop arrangement as a function of the transconductance of the transconductance amplifier and a second voltage at a sensed circuit node connected with the second transistor, the output sense signal being indicative of a current flowing through the second transistor.

In accordance with yet another embodiment, a method of replicating a current flowing through a first transistor to be sensed includes steps of: obtaining a second transistor sized, relative to the first transistor, according to a first scaling factor, the second transistor having an on-resistance equal to an on-resistance of the first transistor multiplied by the first scaling factor; receiving, by the second transistor, a prescribed reference current and generating a first voltage as a function of the reference current and the on-resistance of the second transistor; obtaining at least a first transconductance amplifier coupled with the second transistor; setting a transconductance of the first transconductance amplifier in a closed-loop arrangement as a function of the on-resistance of the second transistor; and generating, by the first transconductance amplifier, an output sense signal in an open-loop arrangement as a function of the transconductance of the first transconductance amplifier and a second voltage at a sensed circuit node connected with the first transistor, the output sense signal being indicative of the current flowing through the first transistor.

Techniques according to embodiments of the present invention provide substantial beneficial technical effects. By way of example only and without limitation, one or more embodiments provide techniques for generating a scaled replica current through a sensed circuit element which includes one or more of the following advantages, among other benefits:

takes only resistance information from a scaled replica element in a closed loop and performs scaling in an open loop for increased speed;
 provides improved low current accuracy and device matching;
 configured for bidirectional current sensing and replication, without the need for an additional sense element, as would otherwise be needed in a differential solution;
 provides inherently stable signal path for single-stage implementations, having no overshoot;
 easy to implement gain trim at reference currents rather than at sense elements.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of exemplary circuits and methods for sensing a current through a switching transistor and replicating the sensed current in the form of an output sense signal generated therefrom. It is to be appreciated, however, that the invention is not limited to the specific circuits and/or methods illustratively shown and described herein. Rather, aspects of the present disclosure relate more broadly to techniques for performing high-speed, scaled replication of a current through a sensed circuit element. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming embodiments of the invention, the term MISFET, as may be used herein, is intended to be construed broadly and to encompass any type of metal-insulator-semiconductor field-effect transistor. The term MISFET is, for example, intended to encompass semiconductor field-effect transistors that utilize an oxide material as their gate dielectric (i.e., metal-oxide-semiconductor field-effect transistors (MOSFETs)), as well as those that do not. In addition, despite a reference to the term "metal" in the acronyms MISFET and MOSFET, the terms MISFET and MOSFET are also intended to encompass semiconductor field-effect transistors wherein the gate is formed from a non-metal such as, for instance, polysilicon; the terms "MISFET" and "MOSFET" are used interchangeably herein.

In the context of sensing a load current passing through a given circuit element, such as, for example, an output transistor in a switching circuit, traditional sensing circuits ordinarily rely on forcing a sense current, generally through the use of a current conveyor, through a replica device to generate a sense output signal that is proportional to the sensed load current. Since most current replication circuits are closed loop, speed is necessarily limited in order to maintain stability (e.g., through the use of a compensation capacitance), which is undesirable especially in high-speed switching applications.

Figure 1:
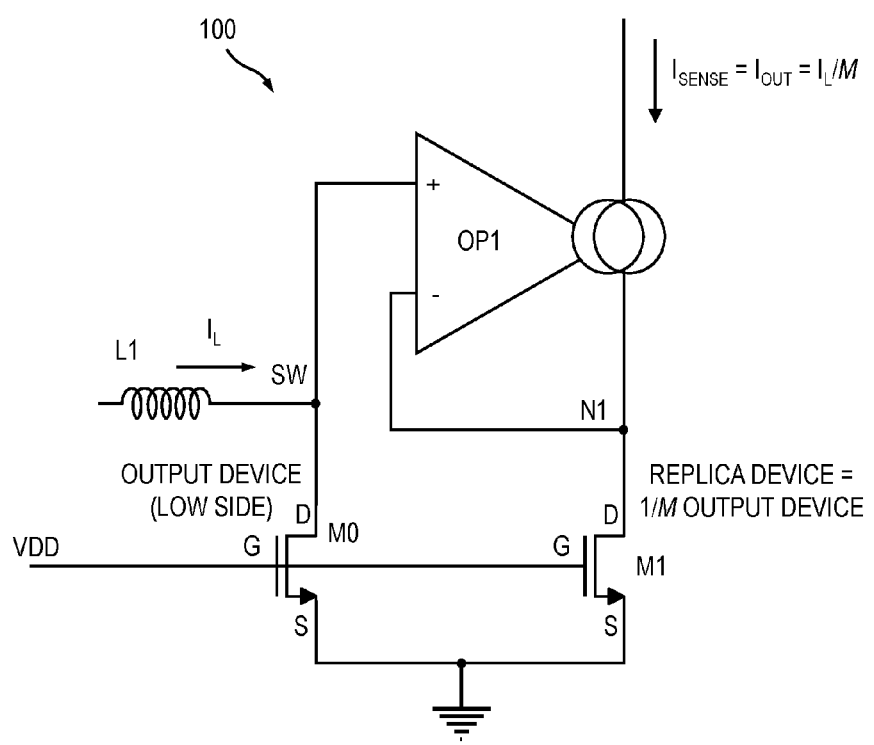
FIG. 1 is a schematic diagram depicting at least a portion of an illustrative circuit for replicating a current through a load device.

FIG. 1 is a schematic diagram depicting at least a portion of an illustrative circuit 100 for replicating a current through a load device. In FIG. 1, only a low-side device is shown. It will become apparent to those skilled in the art, however, that the circuit operation described herein is similarly applicable to a high-side device configuration, wherein a p-channel metal-oxide-semiconductor (PMOS) or n-channel metal-oxide-semiconductor (NMOS) transistor device is connected between a positive voltage supply and a sensed switching node SW.

With reference to FIG. 1, the circuit 100 depicts a load current passing through a load impedance, represented as an inductor L1, connected with a drain (D) of an output NMOS transistor, M0, at node SW. A source (S) of NMOS transistor M0 is connected to ground and a gate (G) of M0 is connected to a bias voltage, which is the positive voltage supply, VDD, in this illustrative embodiment. The circuit 100 further includes a second NMOS transistor, M1, connected to the output transistor M0, and serving as a replica device. More particularly, a gate of transistor M1 is connected to the gate of transistor M0, and a source of M1, like the source of M0, is connected to ground, and thus both transistor devices M0 and M1 will receive the same gate-to-source voltage, $V_{GS}$, applied thereto. With the sizes of the transistor devices M0 and M1 being equal (i.e., equal channel width-to-length ratio (W/L)) and assuming equal drain-to-source voltages, $V_{DS}$, a load current, $I_L$, flowing through the output device M0 will be closely mirrored in the replica device M1.

An operational transconductance amplifier, OP1, is connected in the circuit 100 in a closed-loop configuration which is designed to match the drain voltage, $V_D$, of device M1 with the drain voltage of device M0. An operational transconductance amplifier (OTA) is similar to an operational amplifier (op-amp), except that rather than producing a voltage output for a given voltage input, as in the case of an op-amp, it produces a current output for a given voltage input; in one or more embodiments, an OTA can be implemented as an op-amp driving a pass transistor. More particularly, the drain of NMOS transistor M0 is connected to a non-inverting (+) input of the operational transconductance amplifier OP1 at node SW, and a drain of NMOS transistor M1 is connected to an inverting (−) input of the operational transconductance amplifier OP1 at node N1. The operational transconductance amplifier OP1 is configured to generate an output current, $I_{OUT}$, as a function of a voltage difference between the non-inverting and inverting inputs of the amplifier. The output current $I_{OUT}$ is forced through the replica device M1 such that the voltage at node N1 is the same as the voltage at node SW, assuming an ideal amplifier. In reality, however, the operational transconductance amplifier OP1 will have an error in the output current $I_{OUT}$, resulting from imbalances in the internal components of the amplifier, among other factors, which manifests itself as an offset voltage (e.g., tens of millivolts) between the two inputs of the amplifier.

In order to reduce current consumption in the circuit 100, the size of the replica device M1 can be scaled to be some fraction, 1/M, of the size of the output device M0, where M is an integer; the fraction 1/M is referred to herein as a scaling factor. For example, when the output transistor M0 is twice the size of the replica transistor M1, the scaling factor would be ½. The output current, which may be referred to as a sense current, $I_{SENSE}$, will be scaled in accordance with the scaling factor. Thus, for example, for a general scaling factor of 1/M (i.e., the output transistor device M0 is sized M times larger than the replica transistor device M1), the output sense current $I_{SENSE}$ generated by the operational transconductance amplifier OP1 can be determined according to the following expression:

$I_{SENSE} = I_{OUT} = I_L/M$

The closed-loop arrangement of the operational transconductance amplifier OP1 in the circuit 100 generally requires some compensation mechanism to maintain stability, otherwise oscillations and overshoot can occur. Unfortunately, most compensation schemes inherently limit the closed loop speed, thereby limiting the overall speed of the circuit.

Additionally, providing the circuit 100 with an ability to sense both positive and negative current (i.e., sourcing and sinking current) can be difficult. For example, sinking current requires a rail above the voltage supply or below ground, which undesirably adds to the complexity of the circuit. Alternatively, the sensing may be done differentially, which likely requires a second sense device and careful biasing. These added complexities may make it even more difficult to eliminate offset for high-precision applications.

In order to address one or more problems associated with conventional current sensing and replication techniques, one or more aspects of the present invention advantageously replicates resistance information relating to a sense element in the form of a transconductance ($g_m$), and transforms a voltage present at a sensed circuit node directly to an output sense signal as a function of the replicated resistance information. Using the techniques according to embodiments of the invention, speed is dramatically increased without loss of accuracy or stability. Furthermore, embodiments of the invention provide bidirectional sensing without the need for additional sense elements or complex integrated circuit (IC) fabrication methodologies.

Figure 2:
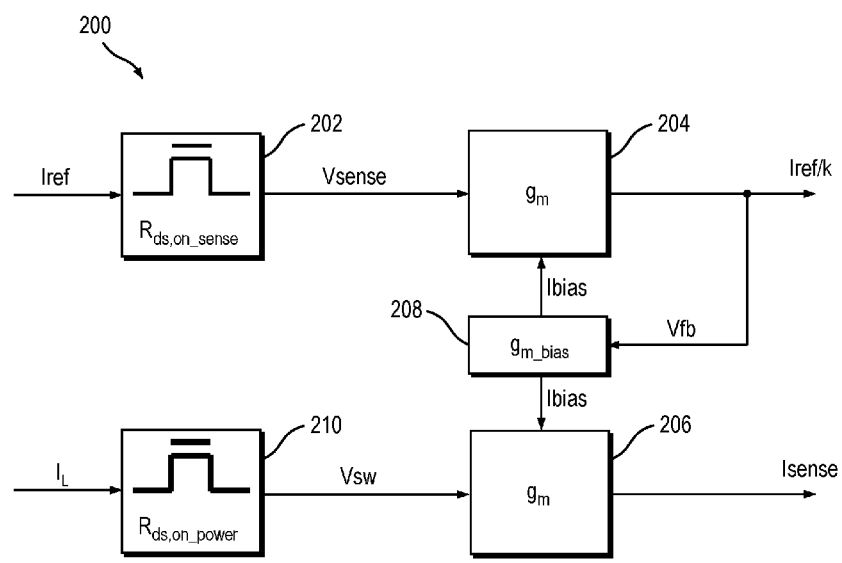
FIG. 2 is a simplified block diagram conceptually depicting at least a portion of an illustrative current sensing and replication circuit for generating a sense signal indicative of a current through a sensed circuit element, according to an embodiment of the invention.

FIG. 2 is a block diagram conceptually depicting at least a portion of an illustrative current sensing and replication circuit 200 for generating a sense signal, Isense, indicative of a current, $I_L$, through a sensed circuit element, according to an embodiment of the invention. As shown in FIG. 2, the circuit 200, which represents a basic implementation of one or more embodiments of the invention, includes a scaled sense device 202, two separate but matched transconductance ($g_m$) stages, 204 and 206, two reference currents, Iref and Iref/k, and a transconductance bias generator ($g_{m\_bias}$) 208. Also shown in FIG. 2 is a sensed circuit element 210, which may comprise a power transistor (e.g., power MOSFET, bipolar junction transistor (BJT), etc.) or other switching device (e.g., silicon-controlled rectifier (SCR), etc.).

In the case of a power MOSFET device, the sensed circuit element 210 will have a drain-to-source on-resistance, $R_{ds,on\_power}$, associated therewith which will be a strong function of gate-to-source voltage, Vgs, and temperature, and a much weaker function of the load current, $I_L$, in a triode region of operation. Likewise, in the case of a MOSFET, the scaled sense device 202 will have a drain-to-source on-resistance, $R_{ds,on\_sense}$, associated therewith that will have a similar gate-to-source voltage and temperature dependence, which with good layout should match the gate-to-source voltage and temperature dependence of the sensed circuit element 210. Because the sense device 202 only operates at a single current, it is preferable that the $R_{ds,on}$ variation with load be small.

With regard to the reference currents Iref and Iref/k, Iref/k is what sets a gain of the transconductance ($g_m$) stages 204, 206. The current Iref flowing through the on-resistance, $R_{ds,on\_sense}$, of the scaled sense device 202 generates a sense voltage, Vsense, and the bias of the transconductance stage 204 is adjusted such that with Vsense as its input, the current Iref/k is generated at its output. In other words:

$$g_m \triangleq \frac{I_{out}}{V_{in}} = \frac{\frac{Iref}{k}}{Vsense} = \frac{\frac{Iref}{k}}{Iref \cdot R_{ds,on\_sense}} = \frac{1}{k \cdot R_{ds,on\_sense}}.$$

This gives both the $g_m$ and a relatively easy way to manipulate the gain away from $1/R_{ds,on}$ by trimming k.

The sense voltage Vsense is fed to an input of the first transconductance stage 204 coupled to the scaled sense device 202. The first transconductance stage 204 is forced to supply an output current, Iref/k, by the closed loop formed with the transconductance bias generator 208. A feedback voltage, Vfb, controls the transconductance bias generator to modulate a supply current, Ibias, of the transconductance stage 204 such that it changes the transconductance, gm. The feedback voltage Vfb will reach equilibrium when the transconductance ($g_m$) of the transconductance stage 204 is equal to Iref/(k·Vsense)=1/(k·$R_{ds,on\_sense}$). Thus, effectively, a quiescent bias point of the transconductance stage 204 is controlled as a function of the on-resistance of the scaled sense device 202. The supply current Ibias generated by the transconductance bias generator 208 is fed to both the first and second transconductance stages 204, 206, which as previously stated are matched to one another, so that a transconductance of each of the first and second transconductance stages are also matched. In this manner, when a switching voltage, Vsw, is applied to the second transconductance stage 206, the output sense current Isense generated by the second transconductance stage will be proportional to the sensed load current $I_L$. An operation of the current sensing and replication circuit 200 will be described in further detail in conjunction with an exemplary embodiment shown in FIG. 3.

Figure 3:
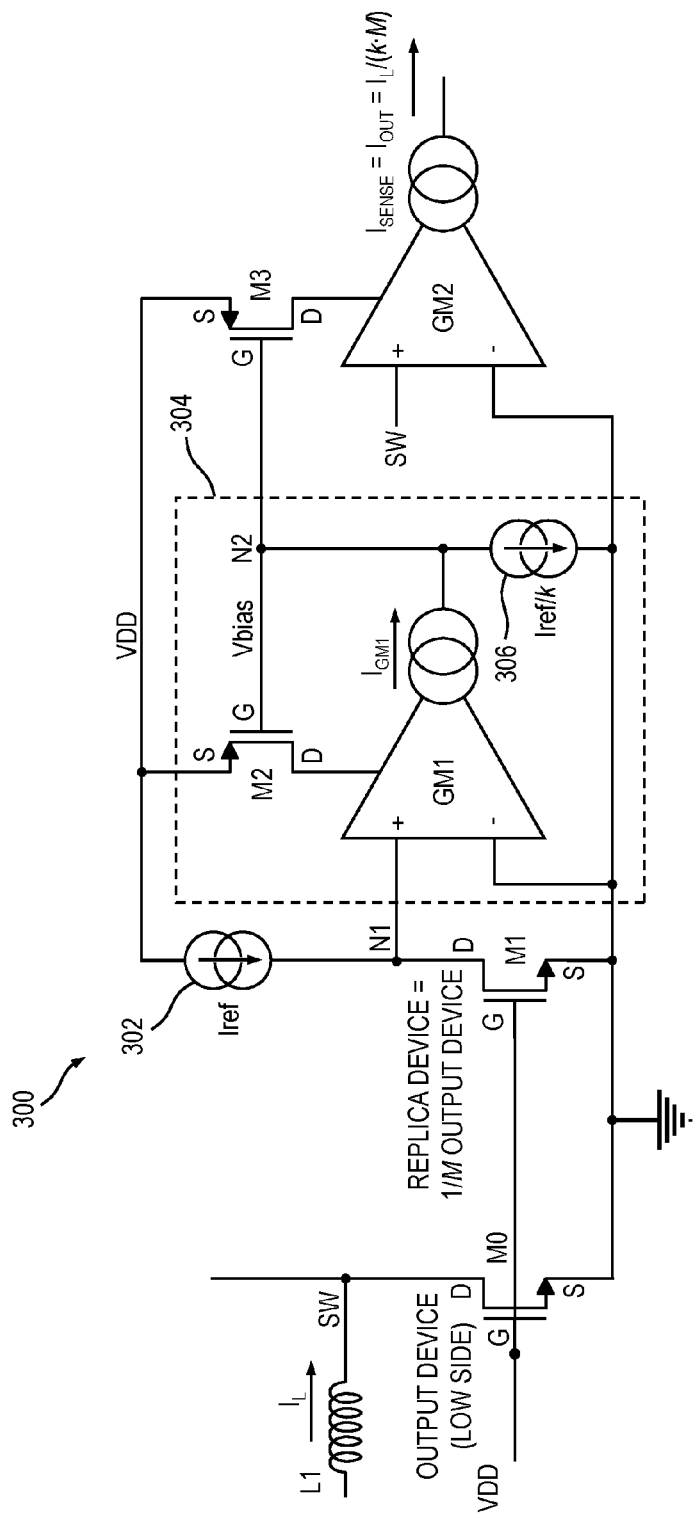
FIG. 3 is a schematic diagram depicting at least a portion of an exemplary circuit for generating a sense signal indicative of a current through a sensed circuit element, according to an embodiment of the invention.

With reference now to FIG. 3, a schematic diagram depicts at least a portion of an exemplary current sensing and replication circuit 300 for generating a sense signal indicative of a current through a sensed circuit element, according to an embodiment of the invention. The circuit 300 includes a load impedance, represented as an inductor L1, connected with a drain (D) of an output NMOS transistor, M0, at a sensed switching node, SW. A source (S) of transistor M0 is connected to ground and a gate (G) of M0 is connected to a bias voltage, which in this illustrative embodiment is the positive voltage supply, VDD, although the invention is not limited to any particular bias voltage, as long as the devices operate in a linear region. The output transistor M0, in one or more embodiments, is a switching device, although aspects of the invention are equally applicable to sensing and replicating the current through other circuit elements. Furthermore, the output transistor M0 is drawn in this illustrative embodiment as a low-side device in its on phase. However, as will become apparent to those skilled in the art, the circuit operation described herein is similarly applicable to a high-side device configuration.

The circuit 300 further includes a second NMOS transistor, M1, connected to the output transistor M0, and serving as a replica device. In the illustrative embodiment shown in FIG. 3, although gates of both transistors M0 and M1 are shown connected together and biased at VDD, in one or more embodiments, the gates of M0 and M1 are separated, with the gate of M1 biased to VDD at all times and the gate of M0 biased to VDD only when performing a sensing operation. More particularly, M0 turns on and off as demanded by the load (on the other side of L1). In this illustrative embodiment, M1 cannot be turned off, as the closed loop needs the node N1 voltage information at all times to avoid settling issues. In one or more embodiments that employ sample and hold circuitry (e.g., as will be described in conjunction with FIGS. 4-6), M1 could be turned off during sensing of M0 to save power, if desired; that is, M1 can be turned off during current replication and turned on when setting the transconductance. The source of transistor M1 is connected to the source of transistor M0, and the gate of M1, while physically separate from the gate of M0, receives the same bias voltage as when the transistor M0 is turned on and sensing.

In this embodiment, the replica transistor M1 is sized to be a prescribed fraction, 1/M, of the sensed output transistor M0, where M is an integer; that is, the replica transistor M1 is scaled to be M times smaller than the output transistor M0. Hence, a drain current passing through the replica transistor M1, $I_{D,M1}$, that is M times smaller than a load current, $I_L$, passing through the output transistor M0 (i.e., $I_{D,M1}=I_L/M$), will result in M0 and M1 having essentially equal drain voltages.

In the circuit 100 shown in FIG. 1, the replica device M1 is connected in a closed-loop feedback configuration which forces the drain voltage of the replica device M1 to be equal to the drain voltage of the output transistor M0. When this occurs, the current $I_{SENSE}$ passing through the replica device M1 will be a scaled version (based on scaling factor M) of the sensed load current $I_L$, as previously described (i.e., $I_{SENSE}=I_L/M$). By contrast, in the exemplary circuit 300 shown in FIG. 3, the drain voltages of transistors M0 and M1 are not required to track one another. Instead, a known reference current, Iref, is forced through the replica device M1 and a drain voltage of M1 is sensed and transformed into a corresponding transconductance, $g_m$.

Specifically, the circuit 300 includes a first current source 302 connected with a voltage supply, which in this embodiment is VDD, at a first terminal. A second terminal of the current source 302 is connected with a drain of the replica transistor M1 at node N1. The current source 302 generates a prescribed reference current, Iref. The drain of transistor M1 is also coupled with a bias generator 304 which is operative to receive, as an input thereto, the drain voltage of the replica transistor device M1 and to generate, as an output thereof, a bias voltage, Vbias, and ultimately a bias current, Ibias, as a function of the drain-to-source on-resistance, $R_{DS,on\_M1}$, of the replica transistor device M1, which equals $M \cdot R_{DS,on\_M0}$ of the sensed output transistor M0. That is, the closed loop in the bias generator 304 adjusts its output to permit the input voltage, $V_{N1}=Iref \cdot R_{DS,on\_M1}$, to result in the output current $I_{GM1}=Iref/k$. This sets the transconductance $g_m=I_{GM1}/V_{N1}=1/(R_{DS,on\_M1} \cdot k))$ or $g_m=1/(R_{DS,on\_M0} \cdot M \cdot k)$, thus copying resistance information of the power transistor M0 directly in the form of a transconductance. Furthermore, so long as the reference currents 302 and 306 are proportional to one another, their absolute values are not critically important for producing an accurate $g_m$.

More particularly, the bias generator 304 includes an operational transconductance amplifier, GM1, and a bias device, which in this embodiment is a PMOS transistor M2, coupled with the transconductance amplifier GM1 in a closed-loop configuration. When compared to the block diagram 200 of FIG. 2, the bias generator 304 of FIG. 3 incorporates the first transconductance stage 204 and the bias generator 208. The bias generator 304 further includes a second current source 306 connected between an output of the transconductance amplifier GM1 and ground. The current source 306 is configured to generate a known current, Iref/k, which is a scaled version of the reference current Iref generated by the first current source 302, where k is a positive real number. Current reference 306 is not limited to connections between the output and ground, and may, for example, be tied between a node internal to the amplifier and supply if desired.

In this embodiment, a non-inverting (+) input of the transconductance amplifier GM1 is connected to the drain of the replica transistor M1 at node N1, an inverting (−) input of the amplifier GM1 is connected to the source of M1 (ground, in this embodiment), and an output of the amplifier GM1 is connected to the current source 306 at node N2; thus the transconductance amplifier GM1 will generate an output signal that is a function of the drain-source voltage of transistor M1. It is to be appreciated that the inputs to the transconductance amplifier GM1 could, in theory, be reversed depending on the polarity of the output sense current and the Iref/k current. The closed negative feedback loop will cause a current, $I_{GM1}$, generated as an output of the transconductance amplifier GM1, to settle at the known current Iref/k from the current source 306.

In this embodiment, the output of the bias generator 304 is connected to a gate of the bias transistor M2 at node N2. A source of transistor M2 is connected to the positive voltage supply VDD, and a drain of M2 is connected with an internal bias node of the transconductance amplifier GM1; the transconductance of the amplifier GM1 is controlled as a function of transistor M2, which sets a bias current in the amplifier GM1. Thus, by forcing a known reference current (Iref) through the replica transistor M1, a voltage is created ($V_{DS}$ of NMOS transistor M1). This voltage is sensed by the transconductance amplifier GM1 and, by forcing the output current $I_{GM1}$ to a scaled copy of the reference current (Iref/k), a voltage-input-to-current-output (i.e., $g_m$) relationship is established. The closed-loop arrangement of the bias generator 304 adjusts the biasing of the transconductance amplifier GM1 to allow the circuit to reach an equilibrium condition. The transconductance ($g_m$) of the amplifier GM1 will be set by the closed loop circuit arrangement to be equal to $1/(k \cdot R_{DS,on})$.

By utilizing this same biasing scheme on a second transconductance amplifier which is closely matched to the first transconductance amplifier GM1, the second amplifier will exhibit a transconductance behavior which closely tracks the transconductance of the first amplifier GM1. Since the transconductance information is obtained at a constant current rather than at a varying load current $I_L$, the accuracy of the replicated current is improved, even at low current levels.

More particularly, the circuit 300 includes a second transconductance amplifier, GM2, which is ideally identically matched to the first transconductance amplifier GM1. An inverting input of the transconductance amplifier GM2 is connected to the inverting input of the first transconductance amplifier GM1 (ground, in this embodiment), and a non-inverting input of amplifier GM2 is adapted to receive the sensed voltage present at the switching node SW. A PMOS bias transistor, M3, is configured having a source connected to VDD, a gate connected to node N2 and adapted to receive the voltage Vbias produced by the bias generator 304, and a drain connected to an internal bias node of the transconductance amplifier GM2. The bias transistor M3 is matched to the bias transistor M2, as is the biasing circuitry internal to both transconductance amplifiers GM1 and GM2. The sensed drain-to-source voltage of the output transistor M0 is passed through the transconductance amplifier GM2, connected in an open-loop configuration, to generate, as an output thereof, an output signal, $I_{SENSE}$, which is a scaled replica of the sensed load current $I_L$ in accordance with the following expression:

$$I_{SENSE}=I_{OUT}=I_L/(k\cdot M)$$

An important benefit of this approach utilized by circuit 300 is that the transconductance is set in a slow, stable closed loop by the transconductance amplifier GM1, and then this transconductance is matched and used in an open-loop configuration by the transconductance amplifier GM2 to generate the output sense signal $I_{SENSE}$. Because the output signal is generated in an open-loop configuration, unlike the circuit 100 shown in FIG. 1, speed is dramatically increased without loss of accuracy or stability.

With regard to the ratio between the two reference currents Iref and Iref/k, k is considered to be a second scaling factor which, when multiplied with the first scaling factor M (indicative of the ratio between the sizes of the output and replica transistors M0 and M1, respectively), will determine an overall scaling between the load current $I_L$ and the output current $I_{SENSE}$ generated by the circuit 300. Thus, manipulating the reference currents Iref and Iref/k used by the $g_m$-setting transconductance amplifier GM1 allows scaling beyond the replica device scaling, which can be trimmed as a correction factor for inaccuracies in M. This arrangement provides greater freedom to choose an optimal M scaling factor for transconductance setting and to suit layout, and allows for more accurate overall scaling as it is much easier to get accuracy and adjustability in scaling current (k) than it is to make accurate replica scaling and adjustability (M). The current sensing and replication circuit 300, according to one or more embodiments, is suitable for use with auto-zero schemes to achieve even greater accuracy, as will be described in further detail in conjunction with FIG. 6.

As previously stated, the closed-loop configuration of the bias generator 304 is operative to set the transconductance of both amplifiers GM1 and GM2 to $1/(k\cdot R_{DS,on})$, where k is the second scaling factor and $R_{DS,on}$ refers to the drain-to-source resistance of the replica transistor M1, which is equal to $M\cdot R_{DS,on}$ of the output transistor M0, where M is the first scaling factor. When the drain-source voltage of transistor M1 increases, the output current $I_{GM1}$ of the transconductance amplifier GM1 will increase, thereby increasing the bias voltage Vbias supplied to bias transistors M2 and M3. As Vbias increases, the bias current generated by transistors M2 and M3 will decrease, thus lowering the transconductance of the amplifiers GM1 and GM2 accordingly, reaching equilibrium when the output current of the GM1 OTA equals Iref/k.

The transconductance amplifier GM2 receives the sensed drain-source voltage of transistor M0 at its non-inverting input. As the load current $I_L$ increases, the sensed drain-source voltage will increase accordingly, thereby proportionally increasing the output sense current $I_{SENSE}$, which is equal to the load current scaled by a product of the first and second scaling factors k and M, respectively; that is, $I_{SENSE}=I_L/(k\cdot M)$.

The overall functionality of the circuit 300 relies primarily on the switch device having an approximately linear voltage-to-current relationship, $R_{DS,on}$, throughout its range of operation. If negative and positive currents are to be sensed, this relationship should extend through the origin; that is, zero volts and zero current. Because $R_{DS,on}$ does vary, the sense current will be most accurate when transistors M1 and M0 have the same drain voltage, and will have slight deviations when they are different.

Figure 4:
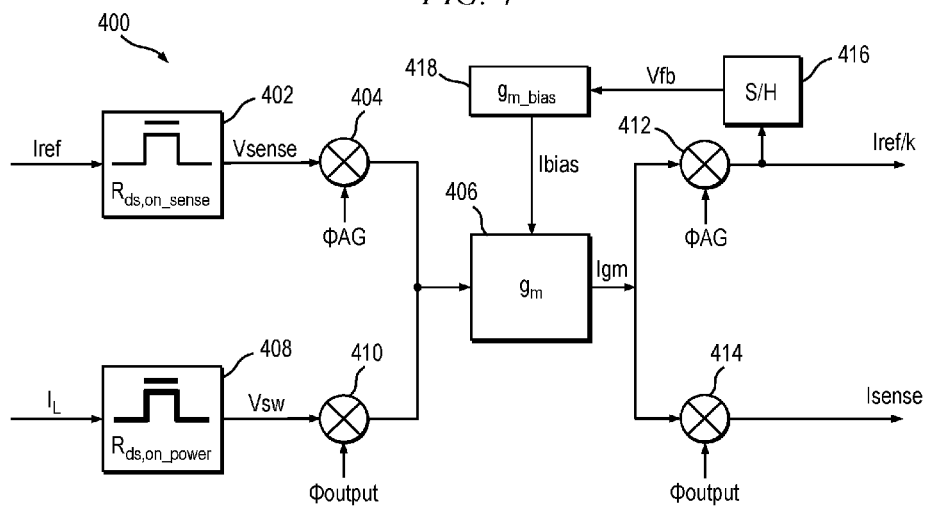
FIG. 4 is a block diagram conceptually depicting at least a portion of an exemplary current sensing and replication circuit for generating a sense signal indicative of a current through a sensed circuit element which utilizes a single transconductance stage, according to an embodiment of the invention.

In order to eliminate the need for two precisely-matched transconductance stages, one or more embodiments of the invention utilize a single transconductance stage in conjunction with a time-multiplexing arrangement. By way of example only and without limitation, FIG. 4 is a block diagram conceptually depicting at least a portion of an exemplary current sensing and replication circuit 400 which utilizes a single transconductance stage for generating a sense signal indicative of a current through a sensed circuit element, according to another embodiment of the invention. With reference to FIG. 4, the current sensing and replication circuit 400 includes a scaled sense device 402, which in one or more embodiments comprises a power MOSFET device. The scaled sense device 402 will have a drain-to-source on-resistance, $R_{ds,on\_sense}$, associated therewith which will be a function of a reference current, Iref, supplied to the sense device. A sense voltage, Vsense, generated at an output of the scaled sense device 402, will be a function of the reference current Iref passing through the sense device and the drain-source on-resistance $R_{ds,on\_sense}$ of the sense device. The output of the sense device 402 is coupled with a first pass device 404 for selectively supplying the sense voltage Vsense to an input of a transconductance amplifier stage 406 as a function of a first control signal, ΦAG, applied to the first pass device.

A sensed circuit element 408, which may comprise a power transistor (e.g., power MOSFET, bipolar junction transistor (BJT), etc.) or other switching device (e.g., silicon-controlled rectifier (SCR), etc.), is also shown in FIG. 4; the sensed circuit element may or may not be incorporated into the current sensing and replication circuit 400. In the case of a power MOSFET device, the sensed circuit element 408 will have a drain-to-source on-resistance, $R_{ds,on\_power}$, associated therewith which will be a function of a load current, $I_L$, flowing through the sensed circuit element. A switching voltage, Vsw, generated at an output of the sensed circuit element 408, will be a function of the load current $I_L$ passing through the sensed device and the drain-source on-resistance $R_{ds,on\_power}$ of the sensed device. The sensed circuit element 408 is coupled with a second pass device 410 for selectively supplying the switching voltage Vsw to the input of the transconductance amplifier 406 as a function of a second control signal, Φoutput, applied to the second pass device.

Each of the pass devices 404, 410 can be implemented in a conventional manner, such as, for example, by using a series MOS transistor (NMOS or PMOS). In this embodiment, the MOS transistor would be configured having a gate adapted to receive a corresponding one of the control signals, a drain connected with either the scaled sense device 402 or the sensed circuit element 408, and a source connected with the transconductance stage 406. In the case of an NMOS pass device, a high voltage (e.g., VDD) control signal supplied to the gate will activate the device. Likewise, in the case of a PMOS pass device, a low voltage (e.g., ground) control signal supplied to the gate will activate the device. It is to be appreciated that embodiments of the invention are not limited to any specific implementation of the pass devices.

The first and second control signals, ΦAG and Φoutput, respectively, are, in one or more embodiments, non-overlapping phases of a clock signal supplied to the current sensing and replication circuit 400, configured such that the first and second pass devices 404, 410 are not concurrently active. Accordingly, the transconductance stage 406 will receive, as an input thereto, either the sense voltage Vsense from the scaled sense device 402 or the switching voltage Vsw from the sensed circuit element 408 at any given time. For switching power supply applications, one clock signal implementation is to use the same phases as that of the output power device 408, such that Φoutput is active when the sensed circuit element 408 is conducting. One skilled in the art will know how to generate non-overlapping multiphase clock signals. In one or more embodiments, during a first clock phase, which may be an auto-gain phase (ΦAG), a gain of the transconductance stage 406 is set, and during a second clock phase, which may be an output phase (Φoutput), a sense current, Isense, proportional to the sensed load current $I_L$ is outputted by the current sensing and replication circuit 400.

The transconductance stage 406 is operative to convert a voltage input signal, received from either of the first and second pass devices 404, 410, into a corresponding output current, Igm. The magnitude of the current Igm will be a function of the corresponding input voltage signal during the particular phase of the clock being used. The current Igm generated by the transconductance stage 406 is supplied to third and fourth pass devices, 412 and 414, respectively. The third and fourth pass devices 412, 414 are independently activated by the first and second control signals ΦAG and Φoutput, respectively, for selectively outputting either a scaled version of the reference current Iref (Iref/k) or a sense current, Isense, indicative of the sensed load current $I_L$. The pass devices 412 and 414, as well as pass devices 404 and 410, may be implemented in a manner that limits charge injection, as will become apparent to those skilled in the art.

The output of the third pass device 412 is coupled with a sample-and-hold (S/H) circuit 416. The sample-and-hold circuit 416 is configured to receive (sample) the scaled version of the reference current Iref/k, which is available during the auto-gain clock phase, and to at least temporarily hold the value of the sampled reference current Iref/k until the next sample period. An output signal, Vfb, generated by the sample-and-hold circuit 416 is supplied to a transconductance bias generator 418 which generates a bias signal, Ibias, as a function of the output signal Vfb. The bias generator 418 is connected in a closed-loop configuration with the transconductance stage 406, with the bias signal Ibias being used for setting a transconductance of the transconductance stage. Since the transconductance stage 406 is used in a time-multiplexed manner, the sample-and-hold serves to hold the feedback voltage value, Vfb, for generating the bias signal Ibias during the output clock phase, when the bias generation loop is broken. During the output phase of the clock, the transconductance of the transconductance stage 406 uses the bias current value held by the sample-and-hold circuit 416, and the output sense current Isense is generated in an open-loop manner.

It is to be understood that the function of the bias generation loop is somewhat independent of the actual division of the blocks in the closed loop shown in FIG. 4. For example, additional stages may be employed, or multiple stages may be combined (with at least a portion of the functions performed by the individual stages incorporated into the combined stage), so long as the bias generation loop reaches equilibrium at the desired transconductance.

Figure 5:
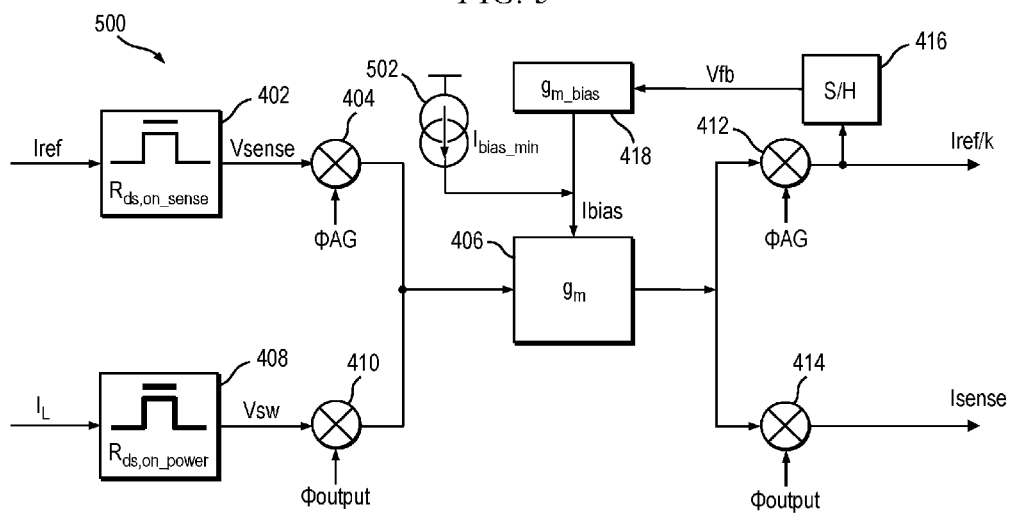
FIG. 5 is a block diagram depicting at least a portion of an exemplary current sensing and replication circuit utilizing a single transconductance stage and noise reduction circuitry, according to an embodiment of the invention.

With reference now to FIG. 5, a block diagram depicts at least a portion of an exemplary current sensing and replication circuit 500 utilizing a single transconductance stage, according to another embodiment of the invention. The current sensing and replication circuit 500 is consistent with the current sensing and replication circuit 400 shown in FIG. 4, except for the inclusion of noise reduction circuitry. Specifically, in order to reduce a noise sensitivity of the sample-and-hold circuit 416, a gain of the transconductance bias generator 418 is reduced by adding a fixed current source 502. The fixed current source 502 is configured to generate a prescribed current, $I_{bias\_min}$, having a value that is near an anticipated lowest bias level of the bias signal Ibias used to set the transconductance of the transconductance stage 406. This technique may be applied to one or more other embodiments, and is not limited to the configuration shown in FIG. 5.

Figure 6:
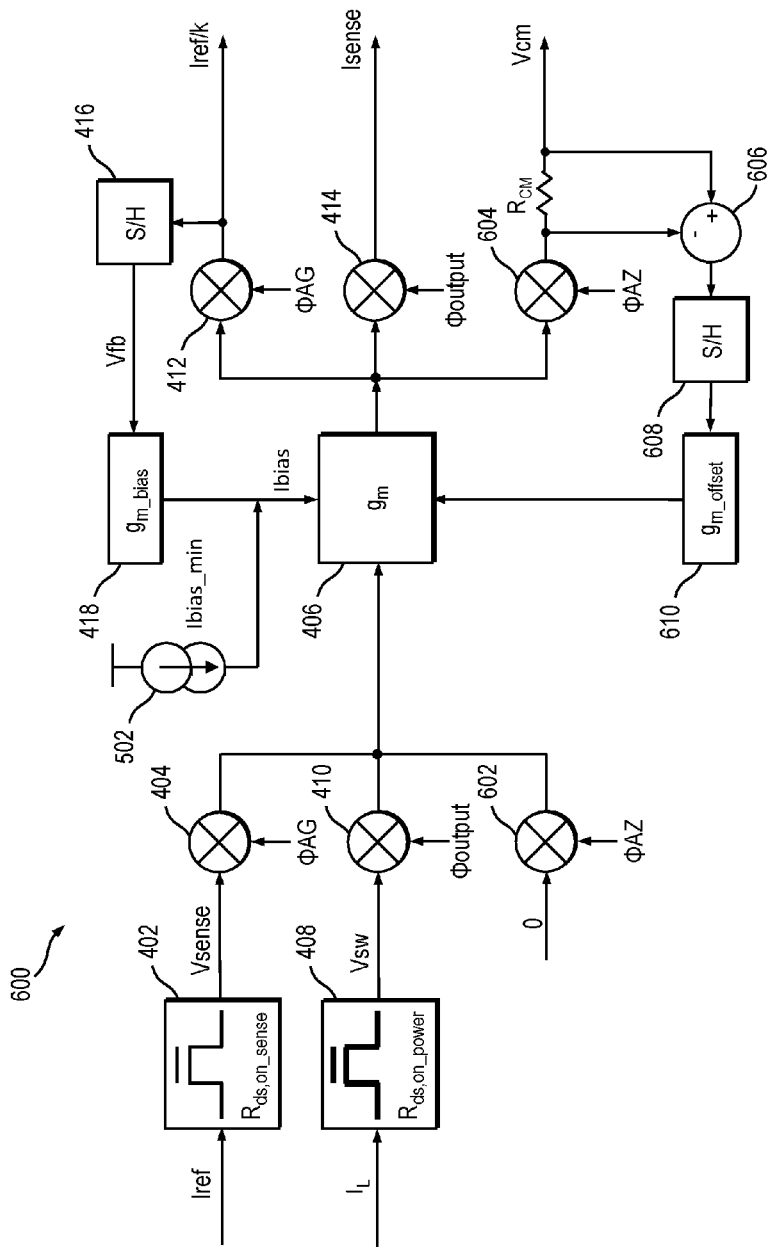
FIG. 6 is a block diagram depicting at least a portion of an exemplary current sensing and replication circuit which incorporates auto-zeroing circuitry, according to an embodiment of the invention.

In a practical implementation, the transconductance stage 406 will generally have an offset error associated therewith which will reduce an accuracy of the current sensing and replication circuit. One or more embodiments reduce this offset error by incorporating auto-zeroing techniques, and thereby improve an overall accuracy of the current sensing and replication circuit. By way of example only and without limitation, FIG. 6 is a block diagram depicting at least a portion of an exemplary current sensing and replication circuit 600 which incorporates auto-zeroing circuitry, according to an embodiment of the invention. More particularly, a third phase, which may be an auto-zero phase (ΦAZ), is added to implement an auto-zero circuit that eliminates the offset of the transconductance amplifier stage 406. Because there are typically only two clock phases available, and because one of the phases must be an output phase for generating the output sense signal, the other phase, in one or more embodiments, may alternate between the auto-gain and auto-zero phases of operation; that is, the other phase alternates between auto-zero and sense loops. It is to be appreciated that other auto-zero techniques may be used, as will become apparent to those skilled in the art. For example, in one or more alternative embodiments, the auto-zero and auto-gain phases can be made to subdivide the second phase, assuming the on-time is known to be sufficiently long.

The auto-zero circuit, in this embodiment, includes a fifth pass device 602 and a sixth pass device 604 which are selectively controlled as a function of a third control signal, ΦAZ, supplied thereto. Like the first and second phases used in the current sensing and replication circuit 500 shown in FIG. 5, the first, second and third phases are preferably non-overlapping clock phases so that the corresponding pairs of pass devices (e.g., 404/412, 410/414 and 602/604) are not concurrently enabled. The fifth pass device 602 is adapted to receive a reference voltage of zero volts (e.g., ground both terminals) and is configured to selective supply this reference voltage to the input of the transconductance amplifier stage 406 when enabled by the third control signal ΦAZ. The sixth pass device 604 is coupled to the transconductance amplifier stage 406 and is operative to output an offset current generated by the transconductance stage when its input is at zero during the auto-zero phase of operation. This offset current is passed through a fixed resistor, $R_{CM}$, to generate a corresponding common-mode voltage, $V_{CM}$, as a function of the offset current.

The voltage developed across the resistor $R_{CM}$ is fed to a summing junction 606 (e.g., adder). This voltage is then fed to a second sample-and-hold circuit 608 which is configured to pass the voltage to a second bias generator 610 during the auto-zero phase, and to hold that voltage during the output and auto-gain phases. The second bias generator 610 is operative to generate an offset current, which is passed to the transconductance amplifier gm. The closed loop formed during the auto-zero phase ideally forces zero voltage across $R_{CM}$, and thus zero offset current with a zero voltage input. This effectively cancels any offset inherently present in the transconductance amplifier stage 406. In this manner, an accuracy of the current sensing and replication circuit 600 is beneficially improved.

Given the discussion thus far, it will be appreciated that a current replication circuit includes a bias circuit and a first transistor sized, relative to a second transistor to be sensed, according to a first scaling factor, the first transistor having an on-resistance associated therewith. The current replication circuit further includes at least one transconductance amplifier having first and second signal paths. The first signal path is connected with the bias circuit in a closed loop configuration such that a quiescent bias point of the transconductance amplifier is controlled as a function of the on-resistance of the first transistor. The second signal path is connected with the second transistor in an open loop configuration and is adapted to convert a sensed input voltage to a corresponding current output signal as a function of the quiescent bias point of the transconductance amplifier, the current output signal being proportional to a current flowing through the second transistor.

Given the discussion thus far, it will also be appreciated that a current sensing and replication circuit includes a first transistor sized, relative to a second transistor to be sensed, according to a first scaling factor, and at least one transconductance amplifier coupled with the first transistor. The first transistor has an on-resistance equal to an on-resistance of the second transistor multiplied by the first scaling factor. The first transistor receives a prescribed reference current and generates a first voltage as a function of the reference current and the on-resistance of the first transistor. A transconductance of the transconductance amplifier is set in a closed-loop arrangement as a function of the on-resistance of the first transistor. The transconductance amplifier generates an output sense signal in an open-loop arrangement as a function of the transconductance of the transconductance amplifier and a second voltage at a sensed circuit node connected with the second transistor, the output sense signal being indicative of a current flowing through the second transistor.

Given the discussion thus far, it will be further appreciated that a method of replicating a current flowing through a first transistor to be sensed includes the steps of: obtaining a second transistor sized, relative to the first transistor, according to a first scaling factor, the second transistor having an on-resistance equal to an on-resistance of the first transistor multiplied by the first scaling factor; receiving, by the second transistor, a prescribed reference current and generating a first voltage as a function of the reference current and the on-resistance of the second transistor; obtaining at least a first transconductance amplifier coupled with the second transistor; setting a transconductance of the first transconductance amplifier in a closed-loop arrangement as a function of the on-resistance of the second transistor; and generating, by the first transconductance amplifier, an output sense signal in an open-loop arrangement as a function of the transconductance of the first transconductance amplifier and a second voltage at a sensed circuit node connected with the first transistor, the output sense signal being indicative of the current flowing through the first transistor.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having enhanced bidirectional current sensing and/or replication in accordance with one or more embodiments of the invention.

An integrated circuit in accordance with aspects of the present disclosure can be employed in essentially any application and/or electronic system where power semiconductor devices are employed (e.g., switching regulators, battery chargers, etc.). Suitable systems and devices for implementing embodiments of the invention may include, but are not limited to, portable electronics (e.g., cell phones), automobiles, computers, display devices, pacemakers, wireless networking devices and systems, etc. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A current replication circuit, comprising:
a first transistor sized, relative to a second transistor to be sensed, according to a first scaling factor, the first transistor having an on-resistance associated therewith;
a bias circuit;
at least a first transconductance amplifier having first and second signal paths, the first signal path being connected with the bias circuit in a closed loop configuration such that a quiescent bias point of the first transconductance amplifier is controlled as a function of the on-resistance of the first transistor, the second signal path being connected with the second transistor in an open loop configuration and being adapted to convert a sensed input voltage to a corresponding current output signal as a function of the quiescent bias point of the first transconductance amplifier, the current output signal being proportional to a current flowing through the second transistor.

2. The circuit of claim 1, wherein the first transconductance amplifier is operative in at least first and second modes, wherein in the first mode the quiescent bias point of the first transconductance amplifier is set as a function of the on-resistance of the first transistor, and in the second mode the first transconductance amplifier is operative to generate the current output signal.

3. The circuit of claim 2, wherein the first and second modes are controlled by first and second non-overlapping phases of a clock signal.

4. The circuit of claim 2, further comprising a sample-and-hold circuit connected with an output of the first transconductance amplifier and configured to store a value of an output signal generated by the first transconductance amplifier during the first mode, wherein the bias circuit is connected in a closed-loop feedback arrangement with the first transconductance amplifier and the sample-and-hold circuit, the bias circuit being configured to generate a bias signal supplied to the first transconductance amplifier for setting a transconductance of the first transconductance amplifier as a function of the stored value of the output signal generated by the first transconductance amplifier during the first mode.

5. The circuit of claim 2, wherein the first transistor receives a prescribed reference current and generates a first voltage as a function of the reference current and the on-resistance of the first transistor, and the first transconductance amplifier generates the current output signal in an open-loop arrangement as a function of a transconductance of the first transconductance amplifier and a second voltage at a sensed circuit node connected with the second transistor, and wherein the circuit further comprises first and second pass devices, the first pass device connected between the first transistor and the first transconductance amplifier and adapted to receive a first control signal for selectively supplying the first voltage to the first transconductance amplifier, the second pass device connected between the second transistor and the first transconductance amplifier and adapted to receive a second control signal for selectively supplying the second voltage to the first transconductance amplifier, the first and second control signals being configured so that the first and second pass devices are not concurrently active.

6. The circuit of claim 5, further comprising:
a sample-and-hold circuit configured to store a value of an output signal generated by the first transconductance amplifier during the first mode; and
third and fourth pass devices, the third pass device connected between the first transconductance amplifier and the sample-and-hold circuit and being adapted to receive the first control signal, the fourth pass device connected to the first transconductance amplifier and being adapted to receive the second control signal, wherein the third pass device passes a scaled version of the reference current as an output during the first mode, and the fourth pass device passes the current output signal as an output during the second mode.

7. The circuit of claim 1, wherein at least a portion of the circuit is fabricated in at least one integrated circuit.

8. A current sensing and replication circuit, comprising:
a first transistor sized, relative to a second transistor to be sensed, according to a first scaling factor, the first transistor having an on-resistance equal to an on-resistance of the second transistor multiplied by the first scaling factor, the first transistor receiving a prescribed reference current and generating a first voltage as a function of the reference current and the on-resistance of the first transistor;

at least a first transconductance amplifier coupled with the first transistor, a transconductance of the first transconductance amplifier being set in a closed-loop arrangement as a function of the on-resistance of the first transistor, the first transconductance amplifier generating an output sense signal in an open-loop arrangement as a function of the transconductance of the first transconductance amplifier and a second voltage at a sensed circuit node connected with the second transistor, the output sense signal being indicative of a current flowing through the second transistor.

9. The circuit of claim 8, wherein the first transconductance amplifier is operative in at least first and second modes, wherein during the first mode, the transconductance of the first transconductance amplifier is set, and during the second mode, the first transconductance amplifier is operative to generate the output sense signal.

10. The circuit of claim 9, wherein the first and second modes are controlled by first and second non-overlapping phases of a clock signal.

11. The circuit of claim 9, further comprising:
a sample-and-hold circuit connected with an output of the first transconductance amplifier and configured to store a value of an output signal generated by the first transconductance amplifier during the first mode; and
a bias generator coupled in a closed-loop feedback arrangement with the first transconductance amplifier and the sample-and-hold circuit, the bias generator being configured to generate a bias signal supplied to the first transconductance amplifier for setting the transconductance of the first transconductance amplifier as a function of the stored value of the output signal generated by the first transconductance amplifier during the first mode.

12. The circuit of claim 9, further comprising first and second pass devices, the first pass device connected between the first transistor and the first transconductance amplifier and adapted to receive a first control signal for selectively supplying the first voltage to the first transconductance amplifier, the second pass device connected between the second transistor and the first transconductance amplifier and adapted to receive a second control signal for selectively supplying the second voltage to the first transconductance amplifier, the first and second control signals being configured so that the first and second pass devices are not concurrently active.

13. The circuit of claim 12, wherein the first and second control signals are non-overlapping phases of a clock signal.

14. The circuit of claim 12, further comprising:
a sample-and-hold circuit configured to store a value of an output signal generated by the first transconductance amplifier during the first mode; and
third and fourth pass devices, the third pass device connected between the first transconductance amplifier and the sample-and-hold circuit and being adapted to receive the first control signal, the fourth pass device connected to the first transconductance amplifier and being adapted to receive the second control signal, wherein the third pass device passes a scaled version of the reference current as an output during the first mode, and the fourth pass device passes the output sense signal as an output during the second mode.

15. The circuit of claim 8, further comprising:
a second transconductance amplifier coupled with the second transistor; and
a bias generator connected with the first transconductance amplifier in a closed-loop feedback arrangement, the bias generator being configured to generate a bias signal supplied to the first and second transconductance amplifiers for setting a transconductance of the first and second transconductance amplifiers as a function of the on-resistance of the first transistor.

16. The circuit of claim 8, wherein at least a portion of the circuit is fabricated in at least one integrated circuit.

17. A method of replicating a current flowing through a first transistor to be sensed, the method comprising:
obtaining a second transistor sized, relative to the first transistor, according to a first scaling factor, the second transistor having an on-resistance equal to an on-resistance of the first transistor multiplied by the first scaling factor;
receiving, by the second transistor, a prescribed reference current and generating a first voltage as a function of the reference current and the on-resistance of the second transistor;
obtaining at least a first transconductance amplifier coupled with the second transistor;
setting a transconductance of the first transconductance amplifier in a closed-loop arrangement as a function of the on-resistance of the second transistor; and
generating, by the first transconductance amplifier, an output sense signal in an open-loop arrangement as a function of the transconductance of the first transconductance amplifier and a second voltage at a sensed circuit node connected with the first transistor, the output sense signal being indicative of the current flowing through the first transistor.

* * * * *